United States Patent
Nobukata et al.

[11] Patent Number: 6,046,933
[45] Date of Patent: Apr. 4, 2000

[54] NONVOLATILE SEMICONDUCTOR MEMORY DEVICE AND IC MEMORY CARD USING SAME

[75] Inventors: Hiromi Nobukata; Yoshitaka Osaka; Ihachi Naiki, all of Kanagawa, Japan

[73] Assignee: Sony Corporation, Japan

[21] Appl. No.: 09/203,597

[22] Filed: Dec. 2, 1998

[30] Foreign Application Priority Data

Dec. 3, 1997 [JP] Japan .................................. 9-333347
May 28, 1998 [JP] Japan .................................. 10-147711

[51] Int. Cl.$^7$ .................................................. G11C 11/34
[52] U.S. Cl. .................. 365/185.03; 365/52; 365/182.23
[58] Field of Search .................. 365/52, 185.03, 365/185.17, 185.23, 185.09

[56] References Cited

U.S. PATENT DOCUMENTS

| | | | |
|---|---|---|---|
| 5,438,648 | 8/1995 | Takaoka et al. | 395/106 |
| 5,584,044 | 12/1996 | Gouhara et al. | 395/894 |
| 5,594,691 | 1/1997 | Bashir | 365/189.09 |
| 5,761,117 | 6/1998 | Uchino et al. | 365/185.03 |
| 5,768,187 | 6/1998 | Uchino et al. | 365/185.03 |
| 5,768,188 | 6/1998 | Park et al. | 365/185.03 |
| 5,859,795 | 1/1999 | Rolandi | 365/168 |

OTHER PUBLICATIONS

A Multi–Level 32 Mb Flash Memory; ISSCC95/Session 7/Paper TA 7.7; p. 132; M. Bauer et al.

*Primary Examiner*—David Nelms
*Assistant Examiner*—Gene N. Auduong
*Attorney, Agent, or Firm*—Rader, Fishman & Grauer; Ronald P. Kananen

[57] ABSTRACT

A nonvolatile semiconductor memory device capable of improving a reliability of a spare region, capable of improving the reliability of a data region in accordance with a method of use, and capable of realizing a function of an additional writing as a multi-level memory, and an IC memory card using the same, provided with a data region capable of storing 4-level and binary data; a spare region capable of storing binary data; data region use decoders for supplying a drive voltage to the data region; spare region use decoders and for supplying the drive voltage to the spare region; a latch circuit for transferring data with the data region in accordance with the number of levels of the multi-level data to be stored in the data region and stopping the supply of the drive voltage of the sub decoder when the transfer of data is normally completed; and a latch circuit for transferring data with the spare region and stopping the supply of the drive voltage of the sub decoder when the transfer of data is normally completed.

16 Claims, 11 Drawing Sheets

FIG. 3

| | DATA REGION USE SUB DECODER | | | | SPARE REGION USE SUB DECODER | | | |
|---|---|---|---|---|---|---|---|---|
| | DRAIN SIDE SG | SELECTED WL | UNSELECTED WL | SOURCE SIDE SG | DRAIN SIDE SG | SELECTED WL | UNSELECTED WL | SOURCE SIDE SG |
| READ | ONLY DATA REGION | VPRD1 | VRD1 | VPRD1 | VPRD1 | 0V | 0V | 0V | 0V |
| | ONLY SPARE REGION | 0V | 0V | 0V | 0V | VPRD2 | VRD2 | VPRD2 | VPRD2 |
| | DATA/SPARE TWO REGION | VPRD1 | VRD1 | VPRD1 | VPRD1 | VPRD2 | VRD2 | VPRD2 | VPRD2 |
| WRITE | ONLY DATA REGION | Vcc | VPGM | Vpass | 0V | 0V | 0V | 0V | 0V |
| | ONLY SPARE REGION (ADDITIONAL WRITING) | 0V | 0V | 0V | 0V | Vcc | VPGM | Vpass | 0V |
| | DATA/SPARE TWO REGION | Vcc | VPGM | Vpass | 0V | Vcc | VPGM | Vpass | 0V |

NONVOLATILE SEMICONDUCTOR MEMORY DEVICE AND IC MEMORY CARD USING SAME

BACKGROUND OF THE INVENTION

1. Field of the Invention

The present invention relates to a nonvolatile semiconductor memory device capable of storing binary or trinary or more data in a memory cell and to an IC memory card using the same.

2. Description of the Related Art

In a nonvolatile semiconductor memory device such as a flash memory, a binary type memory cell structure for storing data taking two values of "0" and "1" in one memory cell transistor is usual.

Along with the recent demands for increasing the capacity of semiconductor memory devices, a so-called multi-level type nonvolatile semiconductor memory device for storing trinary or more data in one memory cell transistor has been proposed (refer to for example "A Multi-Level 32 Mb Flash Memory" '95 *ISSCC* P132 on).

When a nonvolatile semiconductor memory device capable of storing multi-level data, including binary data, in this way is used as data storage, each page is constituted by a data region and a spare region, and the method of use of the spare region is left to the user.

FIG. 10 is a block diagram of an example of the configuration of a nonvolatile semiconductor memory device of the related art.

This nonvolatile semiconductor memory device 10 is constituted by, as shown in FIG. 10, a memory array 11, a main decoder 12, a sub decoder 13 and a multi-level use latch and sense amplifier circuit (LS) 14.

The memory array 11 is constituted by a data region 111 and a spare region 112. For example, management information of the data stored in the data region 111 is stored in the spare region 112.

The data region 111 and the spare region 112 are driven by the single main decoder 12.

FIG. 11 is a circuit diagram of a concrete example of the configuration of the memory array 11 and the main decoder 12. In FIG. 11, a NAND type flash memory is shown as an example.

As shown in FIG. 11, in the memory array 11, memory strings STRG0, STRG1, . . . each constituted by eight serially connected memory transistors M0 to M7 and two selection transistors ST0 and ST1 serially connected to the two ends thereof are arranged in the form of a matrix.

For example, the string STRG0 is allocated as the data region 111, and the string STRG1 is allocated as the spare region 112.

The selection transistor ST0 connected to the drain of the memory transistor M0 of the memory string STRG0 is connected to a bit line BL0, and the selection transistor ST0 connected to the drain of the memory transistor M0 of the memory string STRG1 is connected to a bit line BL1.

Further, the selection transistors ST1, to which the memory transistors M7 of the memory strings STRG0 and STRG1 are connected, are connected to a common source line SL.

Further, gate electrodes of the memory transistors of the memory strings STRG0 and STRG1 arranged in the same row are connected to common word lines WL0 to WL7, the gate electrodes of the selection transistors ST0 are connected to a common selection gate line DSG0, and the gate electrodes of the selection transistors ST1 are connected to a common selection gate line SSG0.

The main decoder 12 is constituted by a main row decoder 120, a transfer gate group 130 which is controlled in its conductive state by the main row decoder 120, word line and selection gate line use drive voltage supply lines VCG0 to VCG7, VDSG, and VSSG from a sub decoder (not illustrated), and a supply line Vpp1 of a program voltage Vpp connected to the main row decoder 120.

The transfer gate group 130 is constituted by transfer gates TW0 to TW7, TD0, TS0, and TF0.

Specifically, the transfer gates TW0 to TW7 operationally connect the word lines WL0 to WL7 and the drive voltage supply lines VCG0 to VCG7 in accordance with an output signal BSEL of the main row decoder 120, respectively. The transfer gates TD0 and TS0 similarly operationally connect the selection gate lines DSG0 and SSG0 and the drive voltage supply lines VDSG and VSSG in accordance with the output signal BSEL of the main row decoder 120.

Further, the transfer gate TF0 is provided for preventing the selection gate line DSG0 from floating in the case of non-selection and connects the selection gate line DSG0 to a ground line at the time of non-selection.

Further, the main row decoder 120 is constituted by a 3-input NAND circuit NA1, inverters INV1 and INV2, a 2-input NAND circuit NA2, depletion type NMOS transistor NT1, enhancement type NMOS transistors NT2 (low threshold voltage) and NT3, and a capacitor C1 formed by connecting the source and the drain of the MOS.

In such a configuration, the reading of the data of the memory transistors M3 of the memory strings STRG0 and STRG1 and the writing of the data into the memory transistors M3 are carried out as follows.

At the time of reading, a ground voltage GND (0V) is supplied to the drive voltage supply line VCG3 by a sub decoder (not illustrated), P5V (for example 4.5V) is supplied to the drive voltage supply lines VCG0 to VCG2 and VCG4 to VCG7 and the drive voltage supply lines VDSG and VSSG, P5V is supplied to the program voltage supply line Vpp1, and the ground voltage 0V is supplied to the source line SL.

The active address signals X1, X2, and X3 are input to the main row decoder 120, while the output signal BSEL of the main row decoder 120 is output at a level of P5V+α.

By this, the transfer gates TW0 to TW7 and TD0 and TS0 of the transfer gate group 130 become conductive. At this time, the transfer gate TF0 is held in the non-conductive state.

As a result, the selection transistors ST0 and ST1 of the memory strings STRG0 and STRG1 become conductive state, and the data is read to the bit lines BL0 and BL1.

At the time of writing, a high voltage, for example, 20V, is supplied to the drive voltage supply line VCG3 selected by the sub decoder 13, an intermediate voltage (for example, 10V) is supplied to the drive voltage supply lines VCG0 to VCG2 and VCG4 to VCG7, a power supply voltage $V_{CC}$ (for example 3.3V) is supplied to the drive voltage supply line VDSG, the ground voltage GND is supplied to the drive voltage supply line VSSG, and, for example, 20V is supplied to the program voltage supply line Vpp1.

Further, the ground voltage GND is supplied to the bit line BL0 to which the memory string STRG0 having the memory transistor M3 to be written, and the power supply voltage $V_{CC}$ is supplied to the bit line BL1 to which the memory string STRG1 having the memory transistor M3 to be inhibited from being written is connected.

The active address signals X1, X2, and X3 are input to the main row decoder 120, while the output signal BSEL of the main row decoder 120 is output at a level of 20V+α.

By this, the transfer gates TW0 to TW7 and TD0 and TS0 of the transfer gate group 130 become conductive state.

As a result, the write voltage 20V is supplied to the selection word line WL3, and a pass voltage (intermediate voltage) Vpass (for example 10V) is supplied to the non-selected word lines WL0 to WL2 and WL4 to WL7.

By this, the selection transistor ST0 of the memory string STRG1 becomes cut-off and channel portions of the memory string STRG1 to which the memory transistor to be inhibited from being written is connected become floating. As a result, the voltages of these channel portions are boosted mainly by capacitor coupling with the pass voltage Vpass supplied to the non-selected word line and rise up to the write inhibit voltage, whereby the writing of data to the memory transistor M3 of the memory string STRG1 is inhibited.

On the other hand, the channel portion of the memory string STRG0 to which the memory transistor to be written is connected is set at the ground voltage GND (0V), the data is written in the memory transistor M3 by the voltage difference from the write voltage 20V supplied to the selected word line WL3, and the threshold voltage shifts in a forward direction and becomes, for example, from −3V of the erasing state to about 2V.

Turning now to the problem to be solved the invention, data storage purpose flash memories of large capacities such as 64 Mbit NAND type flash memories have recently started to appear. Along with this, the market for digital still cameras and other large capacity products has become more active.

Integrated circuit (IC) memory cards using flash memories as storage media have been proposed and marketed and are being used in some digital still cameras. Almost all of the flash memories appearing in the market however are presently binary in format. The specifications are determined based on binary characteristics.

In the case of a flash memory, as mentioned above, an increase of capacity is achieved by miniaturization of the design rule. In addition, this may be realized by a so-called multi-level structure storing a plurality of data in a single cell.

Such a multi-level structure has the merit that two, three, or more times the capacity can be realized by the same generation, but there is a disadvantage that the reliability becomes lower since the distribution of Vth is made narrower.

Further, in NAND and other flash memories for data storage, the "page" serving as the write/read unit is constituted by a data region and a spare region. The method of use of the spare region is left to the user.

When the spare region is used as a management region for a certain data region, a high reliability is required in the management region.

In such a situation, a certain degree of reliability can be secured in the case of binary data, but the reliability of retention etc. is lowered in the case of multi-level data.

Further, in a NAND type flash memory, a function of additional writing (function of additionally writing data in part of a page without erasing which writes "1" into parts for which the additional writing is not carried out) is supported, but this function is possible only for binary data. If it is intended to perform additional writing in a multi-level flash memory, a high voltage is also applied to the gates of the cells for which the data is not to be changed on the same word line, so there is a possibility that the threshold voltage Vth of the cells for which the data is not to be rewritten will change due to the disturbance.

In the case of binary data, the potential difference between the upper limit/lower limit of the distribution and the judgement level is wide, so the data can be correctly read even if the distribution lightly changes, but this potential difference is arrow in the case of multi-level data so the possibility of causing an erroneous reading is high. For this reason, the method of the additional writing can not be supported in the case of multi-level data.

Further, if the management data arranged in the spare region is also arranged in the data region for the purpose of package management etc., since the data region is designed to handle multi-level data in the write/read structure, the management data will also end up being stored in the form of multi-level data. Therefore, management data for which a high reliability is required cannot be arranged in the data region.

SUMMARY OF THE INVENTION

The present invention was made in consideration with such a circumstance and has as its object to provide a nonvolatile semiconductor memory device capable of improving the reliability of the spare region, capable of improving the reliability of the data region in accordance with the method of use, and capable of realizing the function of additional writing as a multi-level memory and an IC memory card using the same.

According to a first aspect of the present invention, there is provided a nonvolatile semiconductor memory device having a memory cell region in which a plurality of memory cell transistors capable of storing binary or trinary or more multi-level data are arranged, wherein a plurality of types of data having different degrees of significance are stored in the memory cell region; and the higher the degree of significance of the data, the lower the number of levels of the multi-level data.

According to a second aspect of the present invention, there is provided a nonvolatile semiconductor memory device having a memory cell region in which a plurality of memory cell transistors capable of storing binary or trinary or more multi-level data are arranged, wherein provision is made of a means capable of storing a plurality of types of data having different degrees of significance in the memory cell region and storing data having a higher degree of significance as data having a lower number of levels of the multi-level data.

According to a third aspect of the present invention, there is provided a nonvolatile semiconductor memory device having a memory cell region in which a plurality of memory cell transistors capable of storing binary or trinary or more multi-level data are arranged, wherein the memory cell region is divided into a plurality of regions; and provision is made of a means for storing the data by different numbers of levels of multi-level data for every divided region.

Preferably, at least one of the divided regions is arranged as a data region capable of storing data by a plurality of number of levels of multi-level data; and at least one of the remaining divided regions is arranged as a spare region capable of store data having a low number of levels of multi-level data.

Alternatively or more preferably further provision is made of a drive signal supplying means for supplying a drive signal to individual divided regions.

More preferably, further provision is made of a means for transferring data with a data region in accordance with the number of levels of the multi-level data to be stored in that data region.

Alternatively more preferably, further provision is made of a first circuit for transferring data with a data region in accordance with the number of levels of the multi-level data to be stored in that data region and stopping the supply of the drive signal of the corresponding drive signal supplying means when the transfer of the data is normally completed and a second circuit for transferring data with a spare region and stopping the supply of the drive signal of the corresponding drive signal supplying means when the transfer of the data is normally completed.

More and still more preferably, further provision is made of a means for stopping the supply of the drive signal of the corresponding drive signal supplying means where the divided region to be supplied with the drive signal is not selected.

According to a fourth aspect of the present invention, there is provided a nonvolatile semiconductor memory device having the memory cell region in which a plurality of memory cell transistors capable of storing binary or trinary or more multi-level data are arranged, wherein the memory cell region is divided into a data region in which the data can be stored by a plurality of number of levels of multi-level data and a spare region in which data having a low number of levels of multi-level data can be stored and provision is made of a first decoding means for supplying a drive signal to the data region and a second decoding means for supplying a drive signal to the spare region.

Preferably, further provision is made of a first latch circuit for transferring data with the data region in accordance with the number of levels of the multi-level data to be stored in the data region and stopping the supply of the drive signal of the first decoding means when the transfer of the data is normally completed and a second latch circuit for transferring data with the spare region and stopping the supply of the drive signal of the second decoding means when the transfer of the data is normally completed.

Alternatively, preferably, further provision is made of a means for stopping the supply of the drive signal of the corresponding first or second decoding means when the data region or spare region to be supplied with the drive signal is not selected.

Preferably, a plurality of the memory cells are connected in series to form a NAND type structure.

According to a fifth aspect of the present invention, there is provided an IC memory card capable of storing and reproducing data with a predetermined apparatus, which comprises a nonvolatile semiconductor memory device having a memory cell region in which a plurality of memory cell transistors capable of storing binary or trinary or more multi-level data are arranged, the region divided into a data region in which data can be stored by a plurality of numbers of levels of multi-level data and a spare region in which data having a low number of levels of multi-level data can be stored; a first decoding means for supplying a drive signal to the data region; and a second decoding means for supplying a drive signal to the spare region.

Preferably, the nonvolatile semiconductor memory device further comprises a first latch circuit for transferring data with the data region in accordance with the number of levels of multi-level data to be stored in the data region and stopping the supply of the drive signal of the first decoding means when the transfer of the data is normally completed and a second latch circuit for transferring data with the spare region and stopping the supply of the drive signal of the second decoding means when the transfer of the data is normally completed.

Alternatively, preferably, the nonvolatile semiconductor memory device further comprises a means for stopping the supply of the drive signal of the corresponding first or second decoding means when the data region or spare region to be supplied with the drive signal is not selected.

Alternatively, preferably, a plurality of the memory cells are connected in series to form a NAND type structure.

That is, in the present invention, a plurality of types of data having different degrees of significance are stored in the memory cell region. At that time, the data having the higher degree of significance is stored by a lower number of levels of multi-level data, that is, a number of levels with reliability.

Further, in the present invention, the memory cell region is divided into a plurality of regions, and the data is stored by a different number of levels of multi-level data for each divided region.

For example, at the time of a read or write operation, the data region side enters the operation mode in which the number of levels of the multi-level data is high or the operation mode in which the number of levels of the multi-level data is low.

On the other hand, the memory array on the spare region side is used as a spare region for storing management information for which a high reliability is required and operates only in an operation mode In which the number of levels of the multi-level data is low.

It is determined whether one or both of the data region and the spare region is accessed. Then, based on this determination, a drive signal is supplied to each drive system of the data region or spare region from the first or second decoding means serving as the drive signal supplying means.

For example, multi-level data having a high number of levels is stored into or read from the data region. On the other hand, where a specific block is used for package management of the spare region for storing management information for which a high reliability is required, multi-level data having a low number of levels or binary data is stored or read.

Further, where either of the data region or spare region is accessed, the supply of the drive signal of the decoding means on the side that is not accessed is stopped.

By this, the so-called "disturb margin" of the read and write operations is improved.

Further, when simultaneously writing In the data region and the spare region, the number of writes until it is judged that all cells have been sufficiently written is smaller in the spare region in which the multi-level data having the low number of levels or binary data is written due to the amount of shift of the threshold voltage Vth.

Further, in the first and second circuits, the judgement of the end of the writing is individually carried out.

As a result of this judgement, the supply of the drive signal of the decoding means corresponding to the sufficiently written region is stopped by the first or second decoding means which previously judged that all cells were sufficiently written. The operation of the decoding means of supplying the drive signal to the region which was sufficiently written is stopped.

Due to this, the write disturb margin of the cells of the region in which the writing ended early is enhanced. Usually, this leads to an improvement of the disturb margin of the spare region.

Further, at the time of so-called additional writing, only the second decoding means for the spare region is controlled to the operation state. The first decoding means for the data region is controlled to the non-operation state.

By this, in the data region, additional writing is realized in a state without write disturbance.

BRIEF DESCRIPTION OF THE DRAWINGS

These and other objects and features of the present invention will become clearer from the following description of the preferred embodiments given with reference to the attached drawings, in which:

FIG. 3 is a view of drive voltages supplied by data region use sub decoders and spare region use sub decoders at read and write operations;

DESCRIPTION OF THE PREFERRED EMBODIMENTS

Below, preferred embodiments of the present invention will be explained with reference to the drawings.

Figure 1:
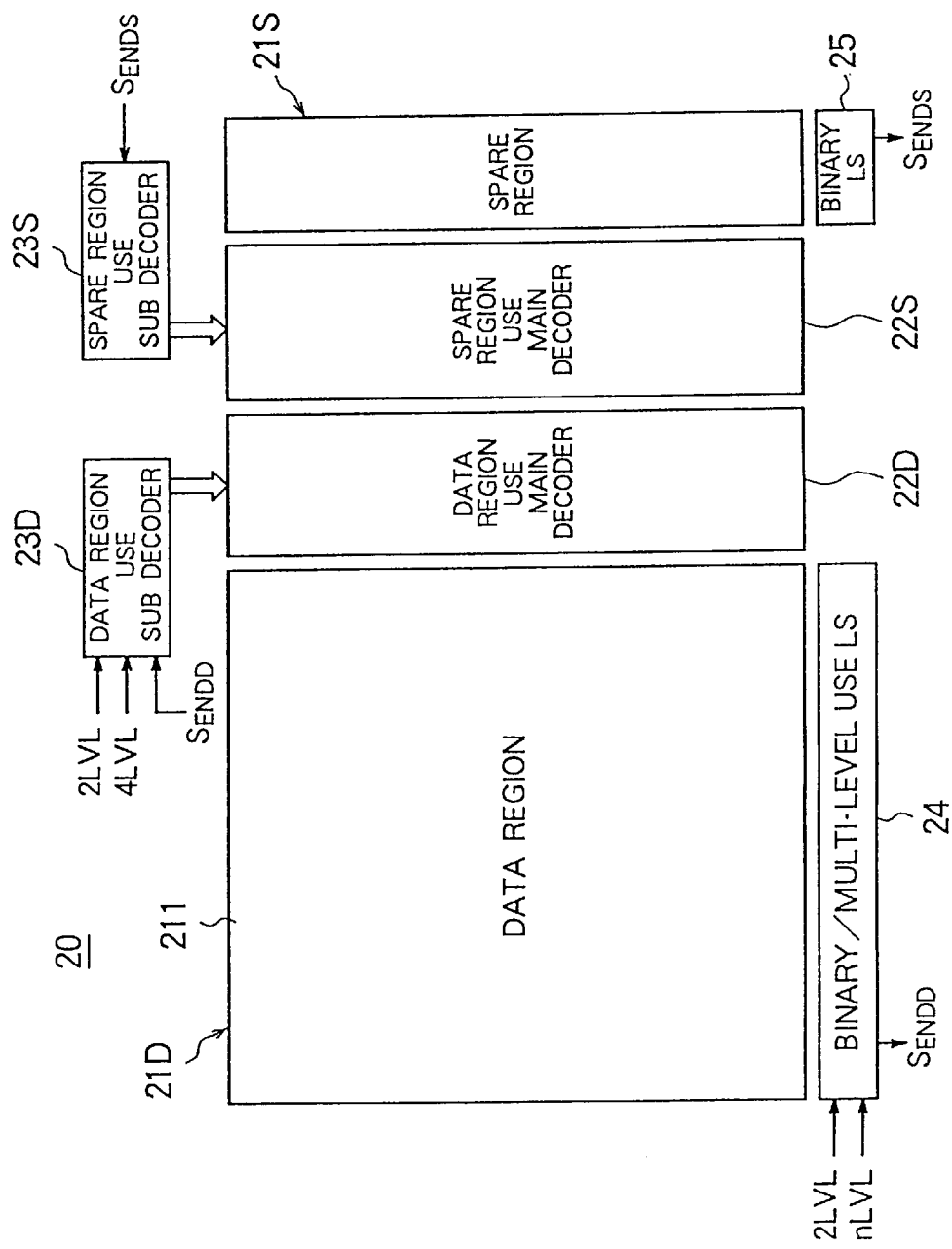
FIG. 1 is a block diagram of an embodiment of a nonvolatile semiconductor memory device according to the present invention.

FIG. 1 is a block diagram of the configuration of an embodiment of a nonvolatile semiconductor memory device according to the present invention.

A nonvolatile semiconductor memory device 20 of the present embodiment is constituted by memory arrays 21D and 21S, a data region use main decoder 22D, a spare region use main decoder 22S, a data region use sub decoder 23D, a spare region use sub decoder 23S, a binary/multi-level latch and sense amplifier circuit (LS) 24, and a binary use latch and sense amplifier circuit (LS) 25.

There are cases where the memory array 21D is driven by the data region use main decoder 22D and used as the data region 211 and cases where a specific block is used as the data region and, at the same time, used as, for example, a region for managing the management data together by storing the same data as the data of the spare region storing the management information for which a high reliability is required.

Trinary or more multi-level (for example 4-level) data is stored in the data region, and binary data is stored in the spare region.

The memory array 21S is driven by the spare region use main decoder 22S and stores the management information of the data stored in for example the data region for which a high reliability is required.

Namely, the memory array 21D and the memory array 21S are driven by different main decoders 22D and 22S, respectively.

Figure 2:
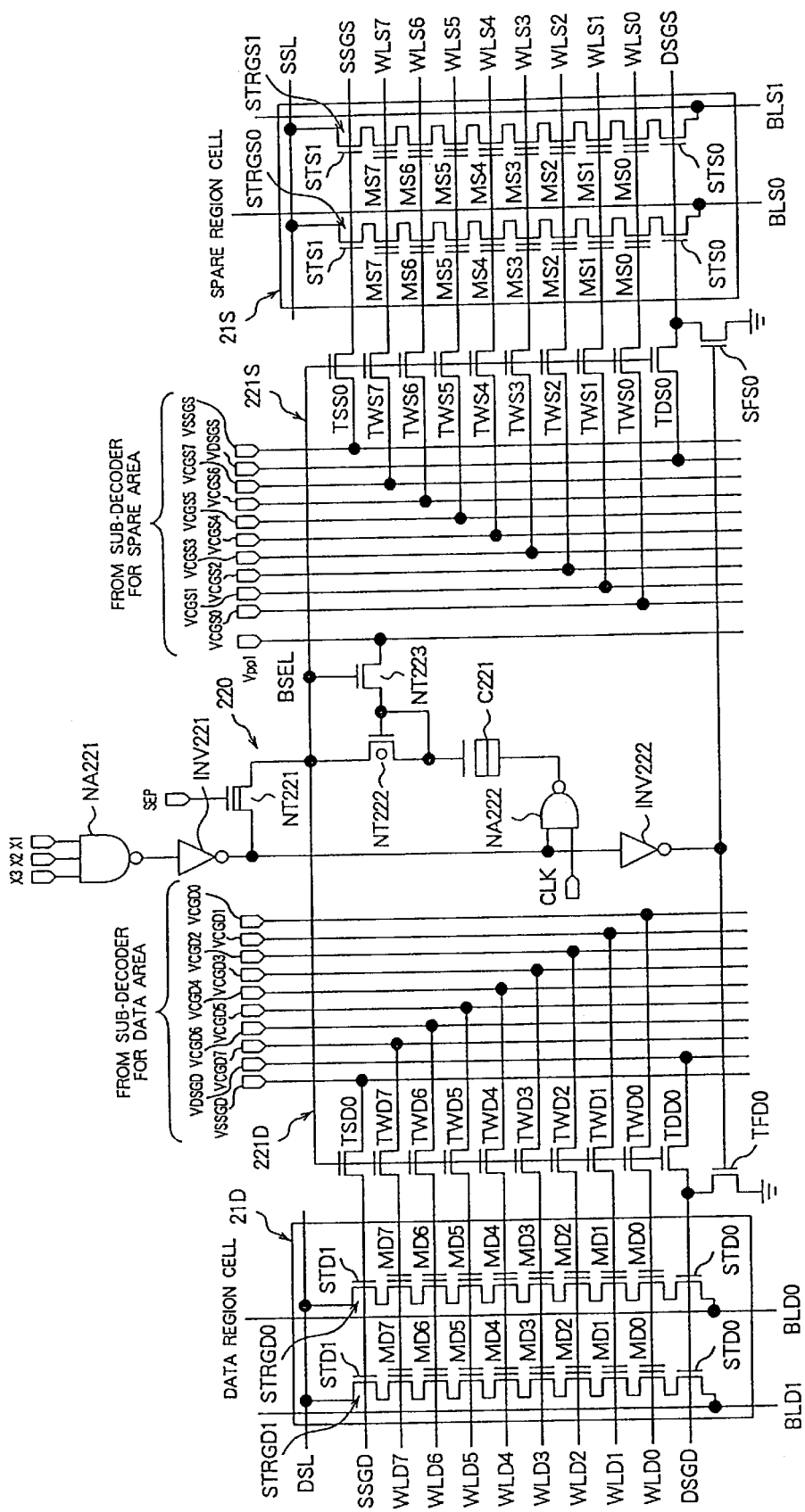
FIG. 2 is a circuit diagram of a concrete example of the configuration of a memory array and a main decoder of FIG. 1.

FIG. 2 is a circuit diagram of a concrete example of the configuration of this memory arrays 21D and 21S and the memory decoders 22D and 22S. In FIG. 2, a NAND type flash memory is shown as an example.

As shown in FIG. 2, in the memory array 21D, memory strings STRGD0, STRGD1 . . . each constituted by eight serially connected memory transistors MD0 to MD7 and two selection transistors STD0 and STD1 serially connected to the two ends thereof are arranged in the form of a matrix.

The selection transistor STD0 connected to the drain of the memory transistor MD0 of the memory string STRGD0 is connected to a bit line BLD0, and the selection transistor STD0 connected to the drain of the memory transistor MD0 of the memory string STRGD1 is connected to a bit line BLD1.

Further, the selection transistors STD1 to which the memory transistors MD7 of the memory strings STRGD0 and STRGD1 are connected are connected to a common source line DSL.

Further, gate electrodes of the memory transistors of the memory strings STRGD0 and STRGD1 arranged in the same row are connected to common word lines WLD0 to WLD7, the gate electrodes of the selection transistors STD0 are connected to a common selection gate line DSGD, and the gate electrodes of the selection transistors STD1 are connected to a common selection gate line SSGD.

In the memory array 21S, memory strings STRGS0, STRGS1 . . . , each constituted by eight serially connected memory transistors MS0 to MS7 and two selection transistors STS0 and STS1 serially connected to the two ends thereof, are arranged in the form of a matrix.

The selection transistor STS0 connected to the drain of the memory transistor MS0 of the memory string STRGS0 is connected to a bit line BLS0, and the selection transistor STS0 connected to the drain of the memory transistor MS0 of the memory string STRGS1 is connected to a bit line BLS1.

Further, the selection transistors STS1 to which the memory transistors MS7 of the memory strings STRGS0 and STRGS1 are connected are connected to a common source line SSL.

Further, gate electrodes of the memory transistors of the memory strings STRGS0 and STRGS1 arranged In the same row are connected to common word lines WLS0 to WLS7, the gate electrodes of the selection transistors STS0 are connected to a common selection gate line DSGS, and the gate electrodes of the selection transistors STS1 are connected to a common selection gate line SSGS.

The data region use main decoder 22D and the spare region use main decoder 22S are arranged adjoining each other between arrangement regions of the memory arrays 21D and 21S and commonly use the main row decoder 220. The supply line Vpp1 of the program voltage Vpp is connected to the main row decoder 220.

The data region use main decoder 22D is constituted by a transfer gate group 221D with a conductive state which is controlled by the main row decoder 220 and supply lines VCGD0 to VCGD7, VDSGD, and VSSGD of the word line and selection gate line use drive voltage from the data region use sub decoder 23D.

The transfer gate group 221D is constituted by transfer gates TWD0 to TWD7, TDD0, TSD0, and TFD0.

Specifically, the transfer gates TWD0 to TWD7 operationally connect the word lines WLD0 to WLD7 and the drive voltage supply lines VCGD0 to VCGD7 in accordance with an output signal BSEL of the main row decoder 220, respectively. The transfer gates TDD0 and TSD0 similarly operationally connect the selection gate lines DSGD and SSGS and the drive voltage supply lines VDSGD and VSSGD in accordance with the output signal BSEL of the main row decoder 220.

Further, the transfer gate TFD0 is provided for preventing the selection gate line DSGD from floating in the case of non-selection and connects the selection gate line DSGD to a ground line at the time of nonselection.

The spare region use main decoder 22S is constituted by a transfer gate group 221S with a conductive state which is controlled by the main row decoder 220 and supply lines VCGS0 to VCGS7, VDSGS, and VSSGS of the word line and selection gate line use drive voltage from the spare region use sub decoder 23S.

The transfer gate group 221S is constituted by transfer gates TWS0 to TWS7, TDS0, TSS0, and TFS0.

Specifically, the transfer gates TWS0 to TWS7 operationally connect the word lines WLS0 to WLS7 and the drive voltage supply lines VCGS0 to VCGS7 in accordance with an output signal BSEL of the main row decoder 220, respectively. The transfer gates TDS0 and TSS0 similarly operationally connect the selection gate lines DSGS and SSGS and the drive voltage supply lines VDSGS and VSSGS in accordance with the output signal BSEL of the main row decoder 220.

Further, the transfer gate TFS0 is provided for preventing the selection gate line DSGS from floating in the case of non-selection and connects the selection gate line DSGS to a ground line at the time of nonselection.

Further, the main row decoder 220 is constituted by a 3-input NAND circuit NA221, inverters INV221 and INV222, a 2-input NAND circuit NA222, depletion type NMOS transistor NT221, enhancement type NMOS transistors NT222 (low threshold voltage) and NT223, and a capacitor C221 formed by connecting the source and the drain of the MOS.

The 3-input terminal of the NAND circuit NA221 is connected to input lines of address decode signals X1, X2, and X3, respectively, while an output terminal is connected to the input terminal of the inverter INV221.

The output terminal of the inverter INV221 is connected to one input terminal of the NAND circuit NA222 and the input terminal of the inverter INV222 and, connected via the NMOS transistor NT221 with the gate connected to the supply terminal SEP of the control signal to the source of the NMOS transistor NT222 and the gate electrode of the NMOS transistor NT223.

The other input terminal of the NAND circuit NA222 is connected to the input line of the clock signal CLK, while the output terminal is connected to one electrode of the capacitor C221. The other electrode of the capacitor C221 is connected to the drain and the gate electrode of the NMOS transistor NT222, while the connection point of the drain and the gate electrode of this is connected to the program voltage supply line. Vpp1 via the NMOS transistor NT223.

The output terminal of the inverter INV222 is connected to the gate of the transfer gate TFD0 of the transfer gate group 221D and the gate of the transfer gate TFS0 of the transfer gate group 221S.

The data region use sub decoder 23D supplies the binary use drive voltage to the supply lines VCGD0 to VCGD7, VDSGD, and VSSGD of the word line and selection gate line use drive voltage when receiving a binary signal 2LVL, while supplies the 4-level drive voltage to the supply lines VCGD0 to VCGD7, VDSGD, and VSSGD of the word line and selection gate line use drive voltage when receiving a 4-level (multi-level) signal 4LVL.

The spare region use sub decoder 23S supplies the binary use drive voltage to the supply lines VCGS0 to VCGS7, VDSGS, and VSSGS of the word line and selection gate line use drive voltage.

FIG. 3 shows drive voltages supplied by the data region use sub decoder 23D and the spare region use sub decoder 23S at the time of read and write operations.

The binary/multi-level latch and sense amplifier circuit (LS) 24 receives a multi-level signal nLVL (n=4 in the case of the present embodiment) and operates as a multi-level use latch and sense amplifier circuit when the memory array 21D is used as the data region 211, while receiving the binary signal 2LVL since the data is stored in a binary form and operates as the binary use latch and sense amplifier circuit when a specific block is used as the region for storing the same management information as that of the spare region for which a high reliability is required.

Figure 4:
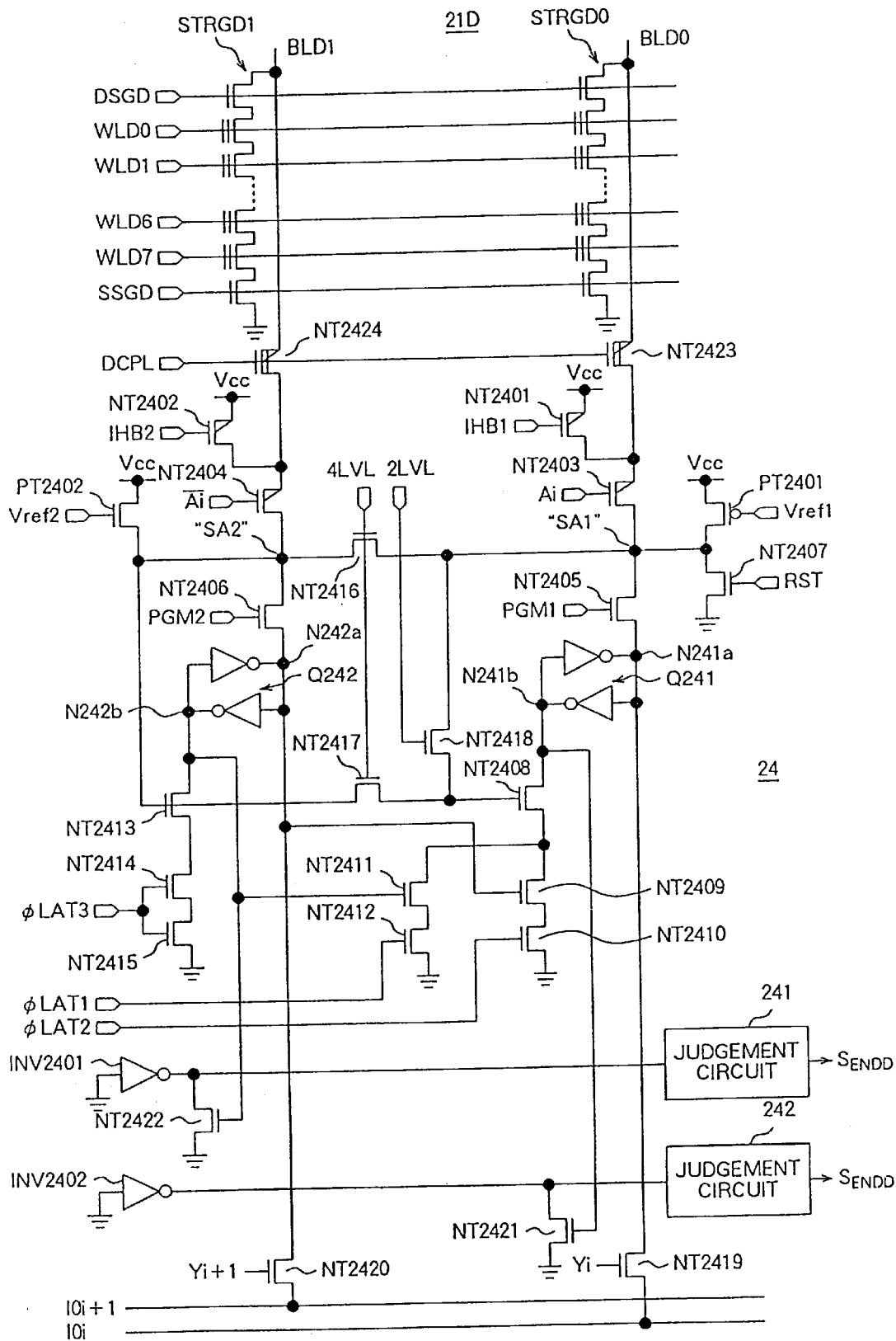
FIG. 4 is a circuit diagram of a concrete example of the configuration of a binary/multi-level latch and sense amplifier circuit.
Figure 5:
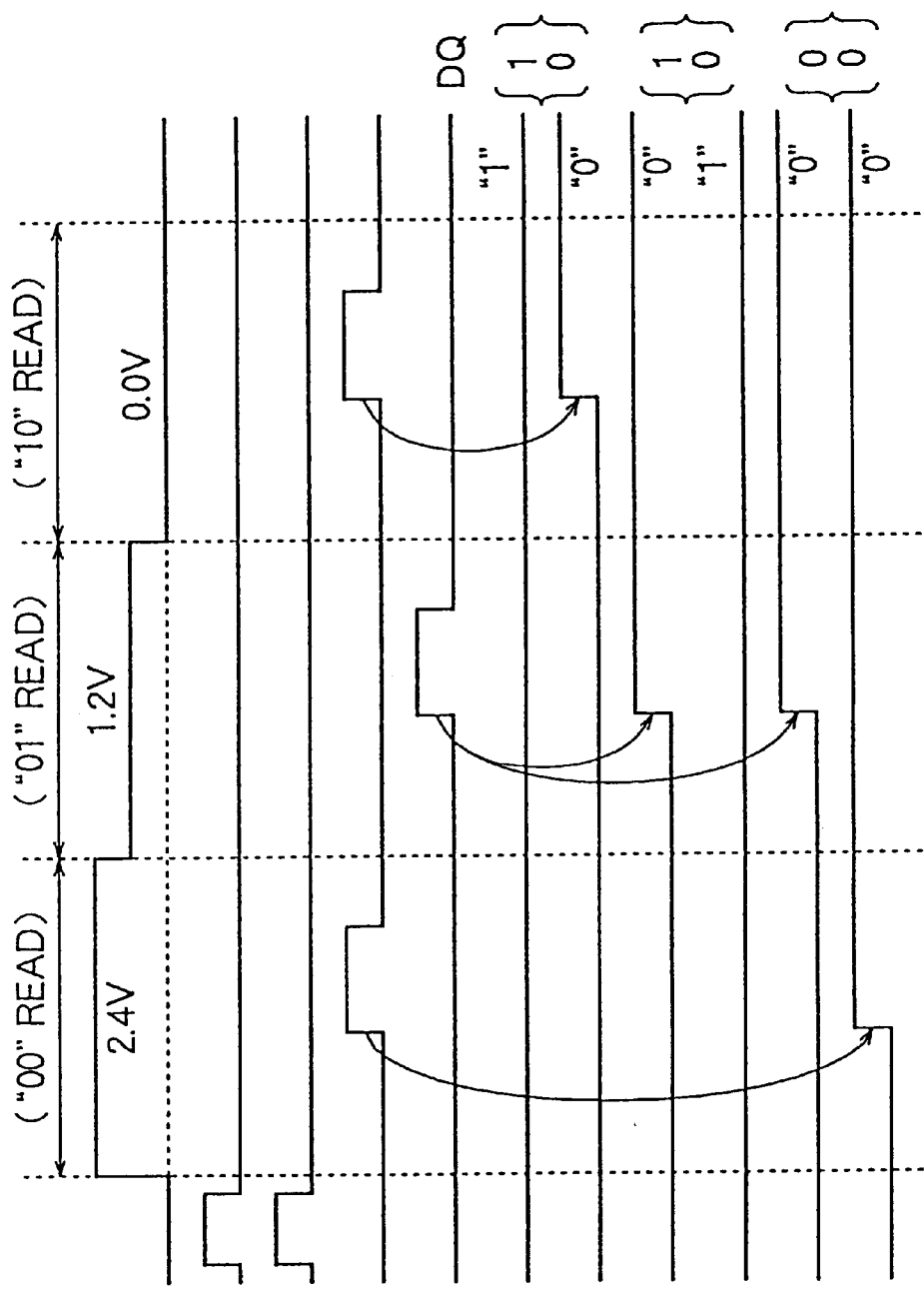
FIGS. 5A to 5K are timing charts for explaining an operation for reading 4-level data in the circuit of FIG. 4.

FIG. 4 is a circuit diagram of a concrete example of the configuration of this binary/multi-level latch and sense amplifier circuit (LS) 24. In FIG. 4, a NAND type flash memory is shown as an example.

The binary/multi-level latch and sense amplifier circuit 24 Is constituted by, as shown In FIG. 4, NMOS transistors NT2401 to NT2424, PMOS transistors PT2401 and PT2402, inverters INV2401 and INV2402, and latch circuits Q241 and Q242 formed by connecting the inputs and the outputs of the inverters with each other.

The NMOS transistor NT2401 is connected between the supply line of the power supply voltage $V_{CC}$ and the connection point of the NMOS transistors NT2403 and NT2423, and the gate electrode is connected to the supply line of the inhibit signal IHB1. The NMOS transistor NT2402 is connected between the supply line of the power supply voltage $V_{CC}$ and the connection point of the NMOS transistors NT2404 and NT2424, and the gate electrode is connected to the supply line of the inhibit signal IHB2.

A depletion type NMOS transistor NT2423 is connected between the connection point of the connection point of the NMOS transistors NT2403 and NT2401 and the connection point of the memory string STRGD0 and the bit line BLD0, and a depletion type NMOS transistor NT2424 is connected between the connection point of the NMOS transistor NT2404 and NMOS transistor NT2402 and the connection point of the memory string STRGD1 and the bit line BLD1. The gates of the NMOS transistors NT2423 and NT2424 are connected to a decouple signal supply line DCPL.

The NMOS transistors NT2403, NT2405, and NT2419 are connected in series between the connection point of the NMOS transistor NT2401 and NT2423 and a bus line $IO_i$, and the NMOS transistors NT2404, NT2406, and NT2420 are connected in series between the connection point of the NMOS transistors NT2402 and NT2424 and a bus line $IO_{i+1}$.

A node SA1 comprising the connection point of the NMOS transistors NT2403 and NT2405 is grounded via the NMOS transistor NT2407 and, connected to the drain of the PMOS transistor PT2401 and is further connected to the gate electrode of the NMOS transistor NT2408 via the NMOS transistor NT2418.

Further, a node SA2 comprising the connection point of the NMOS transistors NT2404 and NT2406 is connected to the drain of the PMOS transistor PT2402 and the gate electrode of the NMOS transistor NT2413.

The node SA1 and the node SA2 are connected via the NMOS transistor NT2416, and the gate electrode of the NMOS transistor NT2413 and the gate electrode of the NMOS transistor NT2408 are connected via the NMOS transistor NT2417.

The gate of the NMOS transistor NT2407 is connected to the supply line of the reset signal RST, the source of the PMOS transistor PT2401 is connected to the supply line of the power supply voltage $V_{CC}$, and the gate of the PMOS transistor PT2401 is connected to the supply line of the signal Vref1.

Further, the source of the PMOS transistor PT2402 is connected to the supply line of the power supply voltage $V_{CC}$, and the gate of the PMOS transistor PT2402 is connected to the supply line of the signal Vref2.

Further, gate electrodes of the NMOS transistors NT2416 and NT2417 are connected to the supply line of the 4-level (multi-level) signal 4LVL, and the gate electrode of the NMOS transistor NT2418 is connected to the supply line of the binary signal 2VLV.

A first storage node N241a of the latch circuit Q241 is connected to the connection point of the NMOS transistors NT2405 and NT2419, and the second storage node N241b is grounded via the NMOS transistors NT2408 to NT2410 connected in series.

A first storage node N242a of the latch circuit Q242 is connected to the connection point of the NMOS transistors NT2406 and NT2420, and the second storage node N242b is grounded via the NMOS transistors NT2413 to NT2415 connected in series.

Further, the connection point of the NMOS transistors NT2408 and NT2409 is grounded via the serially connected NMOS transistors NT2411 and NT2412.

The gate of the NMOS transistor NT2409 is connected to the first storage node N242a of the latch circuit Q242, the gate of the NMOS transistor NT2410 is connected to the supply line of the latch signal ØLAT2, the gate of the NMOS transistor NT2411 is connected to the second storage node N242b, the gate of the NMOS transistor NT2412 is connected to the supply line of the latch signal ØLAT1, and the gates of the NMOS transistors NT2414 and NT2415 are connected to the supply line of the latch signal ØLAT3.

The gate of the NMOS transistor NT2419 serving as the column gate is connected to the supply line of a signal Yi, and the gate of the NMOS transistor NT2420 serving as the column gate is connected to the supply line of a signal Yi+1.

Further, the input terminal of the inverter INV2401 is grounded, and the output terminal is connected to the judgement circuit 241. Further, the NMOS transistor NT2422 is connected between the output terminal of the inverter INV2401 and the ground line. Similarly, the input terminal of the inverter INV2402 is grounded, and the output terminal is connected to the judgement circuit 242. Further, the NMOS transistor NT2421 is connected between the output terminal of the inverter INV2402 and the ground line. The gate electrode of the NMOS transistor NT2421 is connected to the second storage node N241b of the first latch circuit Q241, and the gate electrode of the NMOS transistor NT2422 is connected to the second storage node N242b of the second latch circuit Q242.

The judgement circuits 241 and 242 judge whether or not the writing is ended with respect to all memory cell transistors by the voltages of the output lines of the inverter INV2401 and INV2402 at the time of a write operation and output the end signals SENDDH and SENDDL to the data region use sub decoder 23D when judging that the writing is ended.

Specifically, when the writing is completed, the first storage nodes N241a and N242a of the latch circuits Q241 and Q242 become the power supply voltage $V_{CC}$ level, and the second storage nodes N241b and N242b become the ground level. As a result, the NMOS transistors NT2421 and NT2422 are held in the nonconductive state and the voltages of the output lines of the inverters INV2401 and INV2402 become the power supply voltage $V_{CC}$ level. It is judged by this that the writing is ended.

On the other hand, when there is a cell which is not sufficiently written, any or all of the first storage nodes N241a and N242a of the latch circuits Q241 and Q242 become the ground level, and the second storage nodes N241b and N242b become the power supply voltage $V_{CC}$ level. As a result, the NMOS transistor NT2421 or NT2422 or both transistors are held in the conductive state and the voltages of the output lines of the inverters INV2401 and INV2042 become the ground level. It is judged by this that there is a cell which is not sufficiently written.

Here, an explanation will be made of one example of the operation at the time of reading and writing (programming) of the binary/multi-level latch and sense amplifier circuit 24 in relation to FIGS. 5A to 5K, FIGS. 6A to 6N, FIGS. 7A to 7P, and FIGS. 8A to 8N.

Figure 6:
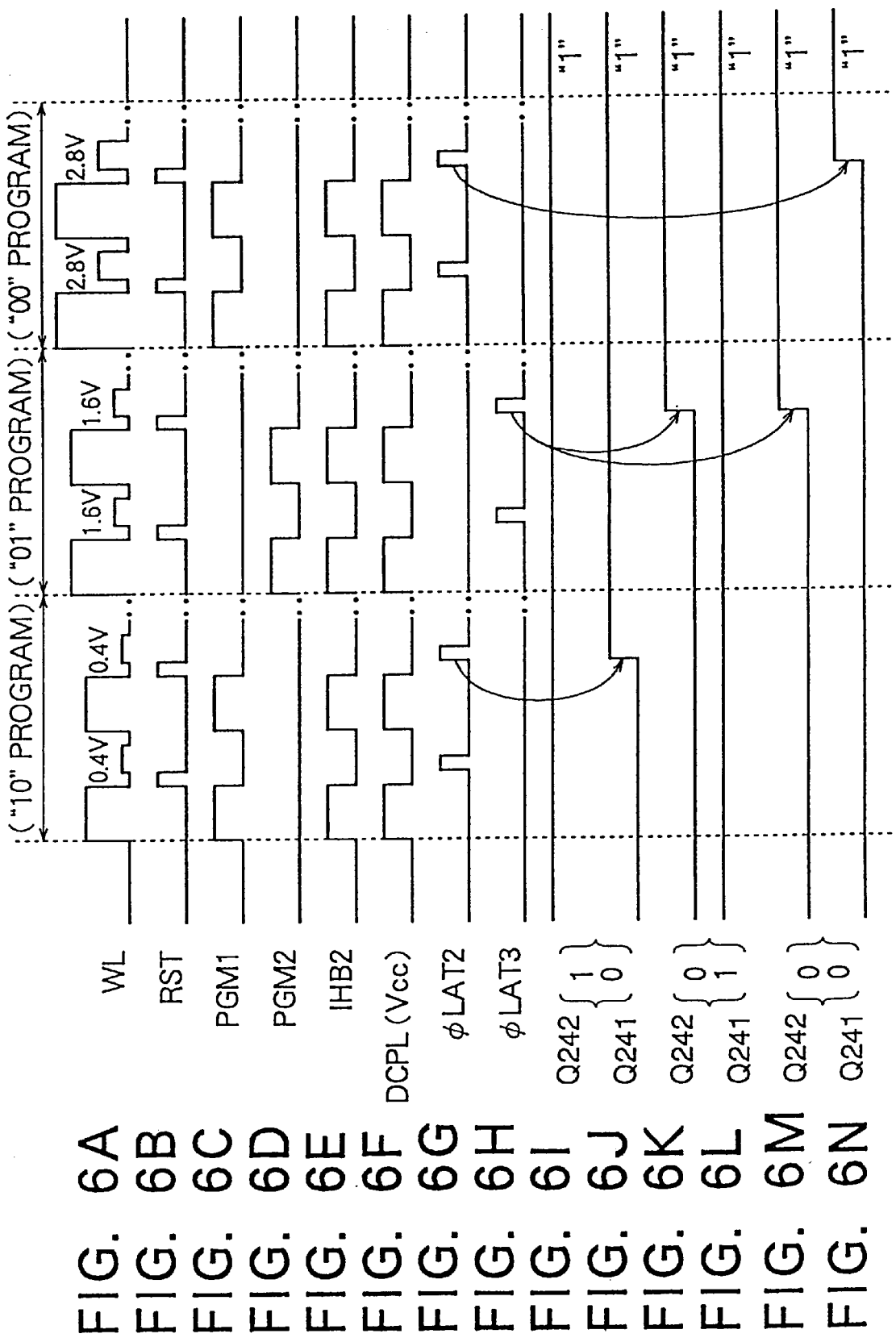
FIGS. 6A to 6N are timing charts for explaining the operation for programming 4-level data in the circuit of FIG. 4.
Figure 7:
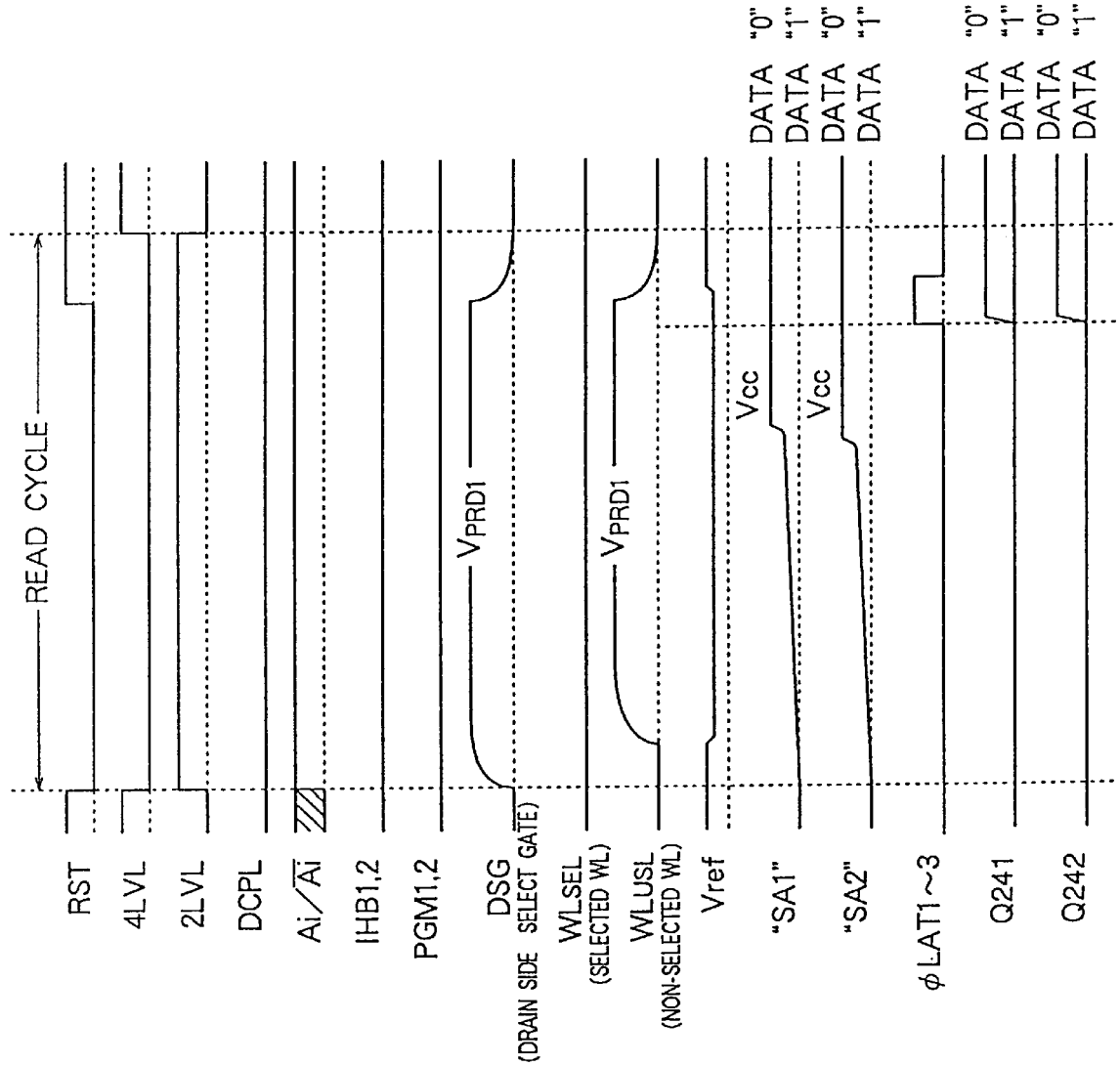
FIGS. 7A to 7P are timing charts for explaining the operation for reading binary data in the circuit of FIG. 4.
Figure 8:
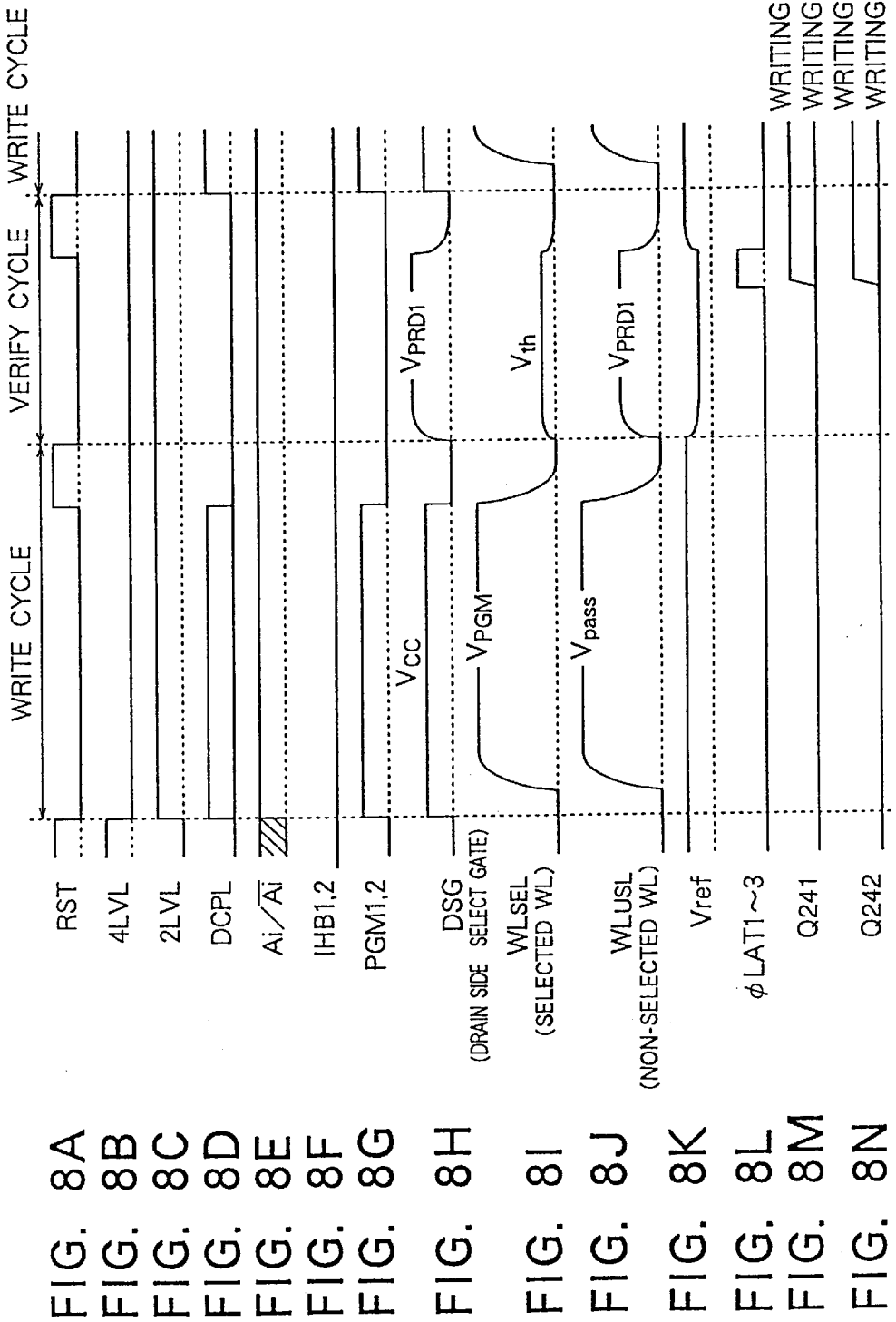
FIGS. 8A to 8N are timing charts for explaining the operation for programming binary data in the circuit of FIG. 4.

FIGS. 5A to 5K show timing charts at the time of reading 4-level data, while FIGS. 6A to 6N show timing charts at the time of writing (programming) 4-level data. Further, FIGS. 7A to 7P show timing charts at the time of reading binary data, while FIGS. 8A to 8N show timing charts at the time of writing (programming) binary data.

Note that, as understood from FIGS. 6A to 6N, the writing of the 4-level data of the present example is carried out in 3 steps. Originally, the operation routine shifts to the next step at the stage where it is decided that all cells to be written when writing in units of pages have been sufficiently written at each step. However, the present invention is not limited to this write method.

First, when reading or writing 4-level data, the 4-level signal 4LVL is input at an active high level, and the binary signal 2LVL is input at a low level (not illustrated in FIGS. 5A to 5K and FIGS. 6A to 6N).

By this, the NMOS transistors NT2416 and NT2417 become conductive, the NMOS transistor NT2418 is held in the non-conductive state, the nodes SA1 and SA2 are electrically connected, and the voltage of the node SA1 is not directly transmitted to the gate electrode of the NMOS transistor NT2408 via the NMOS transistor NT2418.

Next, an explanation will be made of the operation for reading 4-level data.

First, the reset signal RST and signals PGM1 and PGM2 are set at a high level. By this, the first storage nodes N241a and N242a of the latch circuits Q241 and Q242 are pulled to the ground level. As a result, the latch circuits Q241 and Q242 are cleared.

Next, the reading Is carried out by setting the word line voltage at for example 2.4V. If the threshold voltage Vth is higher than the word line voltage (2.4V), the cell current does not flow, therefore the bit line voltage holds the precharge voltage, and its high level is sensed. On the other hand, if the threshold voltage Vth is lower than the word line voltage (2.4V), the cell current flows, therefore the bit line voltage falls, and its low level is sensed.

Next, the reading is carried out at for example the word line voltage of 1.2V, and, finally, the reading is carried out at the word line voltage of 0V. Then, after the reading is carried out three times to obtain the 2-bit data, the data is output to the buses $IO_{i+1}$ and $IO_i$.

Specifically, when the cell data is "00", the current does not flow in all word lines, therefore (1, 1) is output to the buses $IO_{i+1}$, and $IO_i$. First, when reading the data by setting the word line voltage at 2.4V, the latch signal ØLAT1 is set at a high level. At this time, the cell current does not flow, so the bit line is held at a high level, therefore, the NMOS transistor NT2408 is held in the conductive state and the latch circuit Q242 is cleared, whereby the second storage node N242b of the latch circuit Q242 is held at a high level, therefore the NMOS transistor NT2411 is held in the conductive state. Accordingly, the NMOS transistors NT2408, NT2411, and NT2412 are held in the conductive state, the second storage node N241b of the latch circuit Q241 is pulled to the ground level, and the first storage node N241a of the latch circuit Q241 shifts to the high level.

Next, when reading the data by setting the word line voltage at for example 1.2V, the latch signal ØLAT3 is set at a high level. At this time, the cell current does not flow, so the bit line is held at a high level, therefore the NMOS transistor NT2413 is held in the conductive state, the second storage node N242b of the latch circuit Q242 is pulled to the ground level, and the first storage node N242a of the latch circuit Q242 shifts to a high level. Finally, when reading the data by setting the word line voltage at 0V, the latch signal ØLAT1 is set at a high level. At this time, the cell current does not flow, so the bit line is held at high level, therefore the NMOS transistor NT2408 is held in the conductive state, but since the second storage node N242b of the latch circuit Q242 is at a low level, the NMOS transistor NT2411 becomes non-conductive, and the first storage node N241a of the latch circuit Q241 holds its high level.

When the cell data is "01", the current flows only in the case of a predetermined word line voltage, and (1, 0) is output to the buses $IO_{i+1}$ and $IO_i$. First, when reading the data by setting the word line voltage at 2.4V, the latch signal ØLAT1 is set at a high level. At this time, since the cell current flows, the bit line is held at low level, so the NMOS transistor NT2408 is held in the non-conductive state, and the first storage node N241a of the latch circuit Q141 holds its low level.

Next, when reading the data by setting the word line voltage at 1.2V, the latch signal ØLAT3 is set at a high level. At this time, the cell current does not flow, so the bit line is held at a high level, therefore the NMOS transistor NT2413 is held in the conductive state, the second storage node N242b of the latch circuit Q242 is pulled to the ground level, and the first storage node N241a of the latch circuit Q241 shifts to a high level. Finally, when reading the data by setting the word line voltage at 0V, the latch signal ØLAT1 is set at a high level. At this time, the cell current does not flow, so the bit line is held at a high level, therefore the NMOS transistor NT2408 is held in the conductive state, but since the second storage node N242b of the latch circuit Q242 is at a low level, the NMOS transistor NT2411 becomes the nonconductive state, and the first storage node N241a of the latch circuit Q241 holds its low level.

Even in the case where the cell data is "10" and "11", similarly (0, 1) and (0, 0) are read to the buses $IO_{i+1}$ and $IO_i$.

Next, an explanation will be made of the write operation.

In the circuit of FIG. 4, first the writing is carried out by the data stored in the latch circuit Q241, next the writing is carried out by the data of the latch circuit Q242, and finally the writing is carried out by the data of the latch circuit Q241.

When the write data is (Q242, Q241)=(1, 0), the data inverts from "0" to "1" if the latch circuit Q241 becomes the write insufficient state, but in the case of (Q242, Q241)=(0, 0), it is necessary for the latch circuit Q241 to use the same also as the write data of the third step, therefore the data does not (can not) invert from "0" to "1" even if the writing is sufficient at the first step.

In the judgement of the end of the writing at each step, the end of the writing of the step is judged when the latched data becomes all "1".

In a cell with the write data (Q242, Q241)=(0, 0), there is no inversion of the latch circuit Q241 at the first step, therefore there is no judgement of the end by the wired OR.

When reading or writing binary data, the 2-level signal 2LVL is input at an active high level, and the 4-level signal 4LVL is input at a low level (not illustrated in FIGS. 5A to 5K and FIGS. 6A to 6N).

By this, the NMOS transistor NT2418 is held in the conductive state, the NMOS transistors NT2416 and NT2417 become the non-conductive state, and the nodes SA1 and SA2 become the electrically non-connected state. The voltage of the node SA1 is directly transmitted to the gate electrode of the NMOS transistor NT2408 via the NMOS transistor NT2418.

Further, "Ai", "/Ai" are all selected (both are $V_{CC}$), and both of "IHB1" and "IHB2" are fixed at GND, whereby the bit lines and the data latches enter into a one-to-one relationship, and a binary operation becomes possible.

Here, a detailed explanation of the reading and writing of binary data will be omitted.

Further, in the control of the read/verify operation, by setting the signal ØLAT3 at a high level, the potential of the node SA2 is reflected at the latch circuit Q242, while by simultaneously setting the signals ØLAT1 and ØLAT2 at a high level, either of the NMOS transistor NT2411 or NMOS transistor NT2409 becomes conductive, and the potential of the node SA1 is reflected at the latch circuit Q241.

As described above, for example, when the nonvolatile semiconductor memory device of the present embodiment is applied to an IC memory card, a multi-level flash memory which can be changed to a binary flash memory without changing the specifications of the IC memory card is realized.

In the binary use latch and sense amplifier circuit (LS) 25, the memory array 21S is used as the spare region for storing the management information for which a high reliability is required. The data is stored in a binary form, therefore the circuit operates as a dedicated binary latch and sense amplifier circuit.

Figure 9:
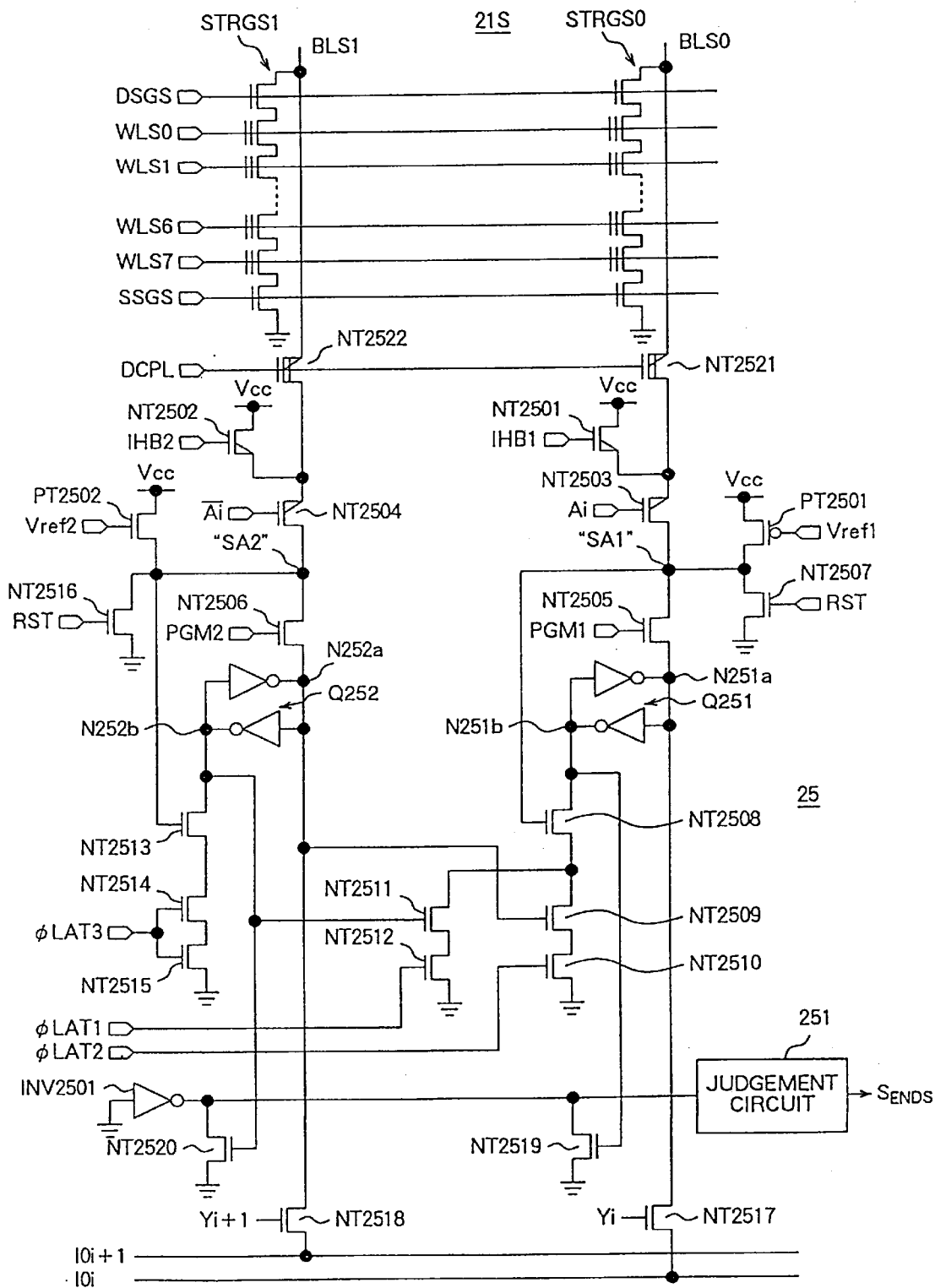
FIG. 9 is a circuit diagram of a concrete example of the configuration of a binary use latch and sense amplifier circuit.
Figure 10:
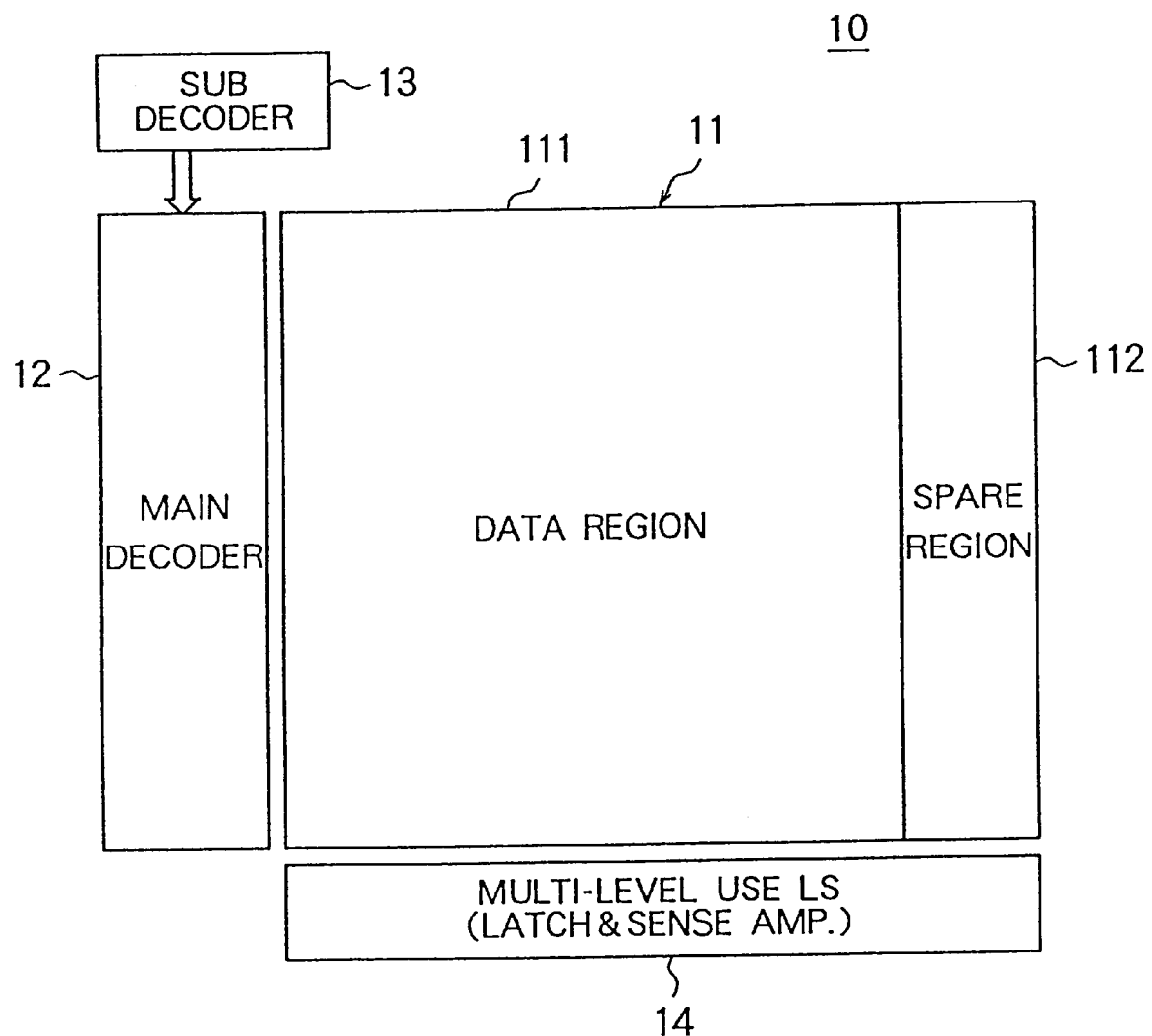
FIG. 10 is a block diagram of an example of the configuration of a nonvolatile semiconductor memory device of the related art.
Figure 11:
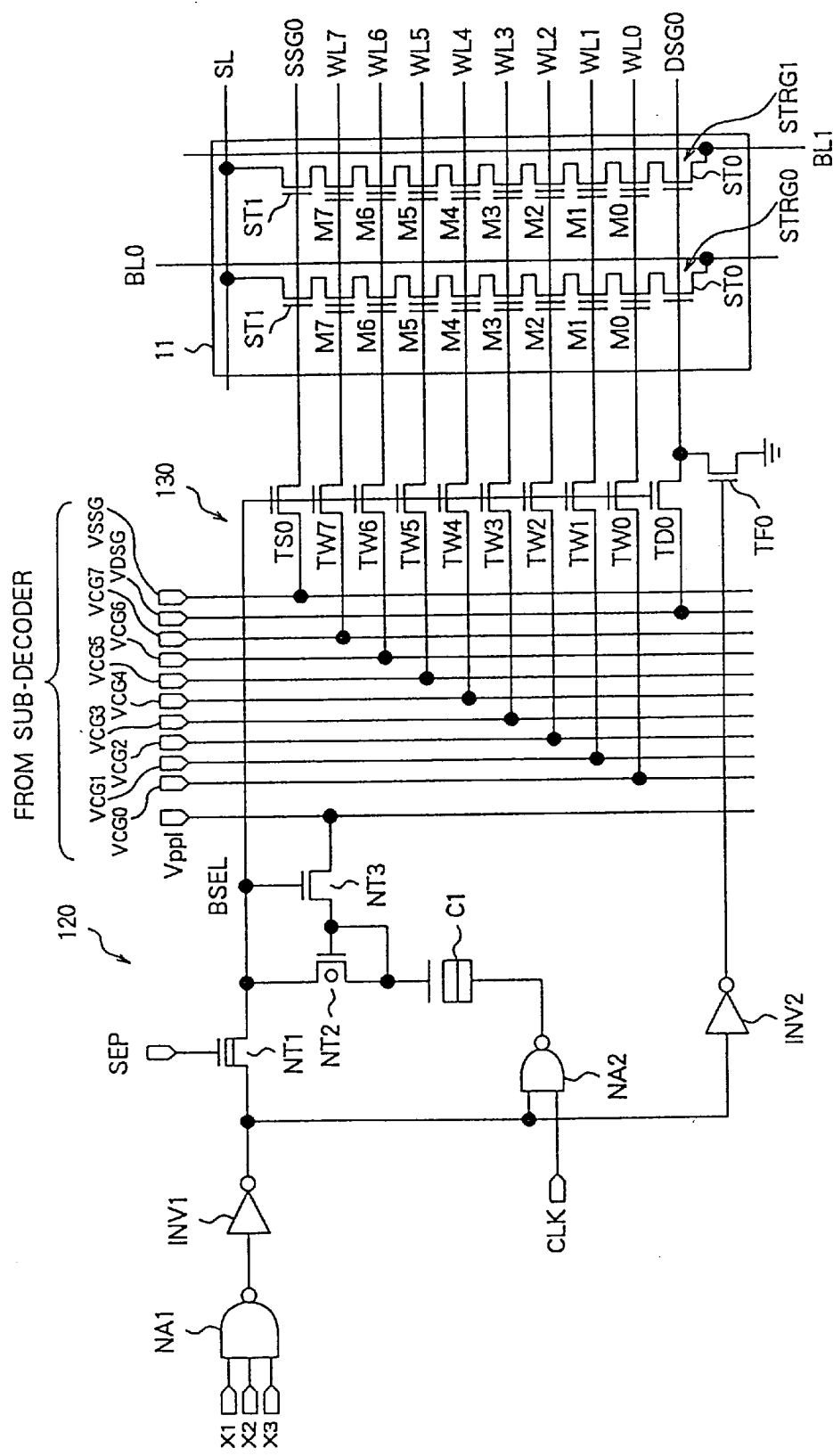
FIG. 11 is a circuit diagram of a concrete example of the configuration of the memory array and the main decoder of FIG. 10.

FIG. 9 is a circuit diagram of a concrete example of the configuration of this binary latch and sense amplifier circuit (LS) 25. In FIG. 9, a NAND type flash memory is shown as an example.

The binary latch and sense amplifier circuit 25 is constituted by, as shown in FIG. 9, NMOS transistors NT2501 to NT2522, PMOS transistors PT2501 and PT2502, an inverter INV2501, and latch circuits Q251 and Q252 formed by connecting the inputs and the outputs of the inverters with each other.

The NMOS transistor NT2501 is connected between the supply line of the power supply voltage $V_{CC}$ and the connection point of the NMOS transistors NT2503 and NT2521, and the gate electrode is connected to the supply line of the inhibit signal IHB1. The NMOS transistor NT2502 is connected between the supply line of the power supply voltage $V_{CC}$ and the connection point of the NMOS transistors NT2504 and NT2522, and the gate electrode is connected to the supply line of the inhibit signal IHB2.

A depletion type NMOS transistor NT2521 is connected between the connection point of the NMOS transistor NT2503 and the NMOS transistor NT2501 and the connection point of the memory string STRGS0 and the bit line BLS0, and a depletion type NMOS transistor NT2522 is connected between the connection point of the NMOS transistor NT2504 and the NMOS transistor NT2502 and the connection point of the memory string STRGS1 and the bit line BLS1. The gates of the NMOS transistors NT2521 and NT2522 are connected to a decouple signal supply line DCPL.

The NMOS transistors NT2503, NT2505, and NT2517 are connected in series between the connection point of the NMOS transistors NT2501 and NT2521 and a bus line $IO_j$, and the NMOS transistors NT2504, NT2506, and NT2518 are connected in series between the connection point of the NMOS transistors NT2502 and NT2522 and a bus line $IO_{i+1}$.

A node SA1 comprising the connection point of the NMOS transistors NT2503 and NT2505 is grounded via the NMOS transistor NT2507 and, connected to the drain of the PMOS transistor PT2501 and is further connected to the gate electrode of the NMOS transistor NT2508.

Further, a node SA2 comprising the connection point of the NMOS transistors NT2504 and NT2506 is ground via the NMOS transistor NT2516 and is connected to the drain of the PMOS transistor PT2502 and the gate electrode of the NMOS transistor NT2513.

The gates of the NMOS transistors NT2507 and NT2516 are connected to the supply line of the reset signal RST, the source of the PMOS transistor PT2501 is connected to the supply line of the power supply voltage $V_{CC}$, and the gate of the PMOS transistor PT2501 is connected to the supply line of the signal Vref1.

Further, the source of the PMOS transistor PT2502 is connected to the supply line of the power supply voltage $V_{CC}$, and the gate of the PMOS transistor PT2502 is connected to the supply line of the signal Vref2.

A first storage node N251a of the latch circuit Q251 is connected to the connection point of the NMOS transistors NT2505 and NT2517, and the second storage electrode N251b is grounded via the NMOS transistors NT2508 to NT2510 connected in series.

A first storage node N252a of the latch circuit Q252 is connected to the connection point of the NMOS transistors NT2506 and NT2518, and the second storage electrode N252b is grounded via the NMOS transistors NT2513 to NT2515 connected in series.

Further, the connection point of the NMOS transistors NT2508 and NT2509 is grounded via the serially connected NMOS transistors NT2511 and NT2512.

The gate of the NMOS transistor NT2509 is connected to the first storage node N252a of the latch circuit Q252, the gate of the NMOS transistor NT2510 is connected to the supply line of the latch signal ØLAT2, the gate of the NMOS transistor NT2511 is connected to the second storage node N252b, the gate of the NMOS transistor NT2512 is connected to the supply line of the latch signal ØLAT1, and the gates of the NMOS transistors NT2514 and NT2515 are connected to the supply line of the latch signal ØLAT3.

The gate of the NMOS transistor NT2517 serving as the column gate is connected to the supply line of a signal Yi, and the gate of the NMOS transistor NT2518 serving as the column gate is connected to the supply line of a signal Yi+1.

Further, the input terminal of the inverter INV2501 is grounded, and the output terminal is connected to the judgement circuit 251. Further, NMOS transistors NT2519 and NT2520 are connected in parallel between the output terminal of the inverter INV2501 and the ground line. The gate electrode of the NMOS transistor NT2519 is connected to the second storage node N251b of the first latch circuit Q251, and the gate electrode of the NMOS transistor NT2520 is connected to the second storage node N252b of the second latch circuit Q252.

The judgement circuit 251 judges whether or not the writing is ended with respect to all memory cell transistors by the voltage of the output line of the inverter INV2501 at the time of a write operation and outputs the end signal SENDS to the sub decoder 23S when judging that the writing is ended.

Specifically, when the writing is completed, the first storage nodes N251a and N252a of the latch circuits Q251 and Q252 become the power supply voltage $V_{CC}$ level, and the second storage nodes N251b and N252b become the ground level. As a result, the NMOS transistors NT2521 and NT2522 are held in the nonconductive state and the voltage of the output line of the inverter INV2501 becomes the power supply voltage $V_{CC}$ level. It is judged by this that the writing is ended.

On the other hand, when there is a cell which is not sufficiently written, any or all of the first storage nodes N251a and N252a of the latch circuits Q251 and Q252 become the ground level, and the second storage nodes N251b and N252b become the power supply voltage $V_{CC}$ level. As a result, the NMOS transistor NT2519 or NT2520 or both transistors are held in the conductive state and the voltage of the output line of the inverter INV2501 becomes the ground level. It is judged by this that there is a cell which is not sufficiently written.

This binary use latch and sense amplifier circuit 25 performs a similar operation as with the binary operation of the binary/multi-level latch and sense amplifier circuit 24.

Next, an explanation will be made of the operation of the device of FIG. 1.

For example, at the time of a read or write operation, either of the 4-value signal 4LVL and the binary signal 2LVL is made active and input to the data region use sub decoder 23D and the binary/multi-level latch and sense amplifier circuit 24.

By this, the data region side enters the 4-value operation mode or the binary operation mode.

On the other hand, the memory array 21S of the spare region side is used as a spare region for storing management information for which a high reliability is required. The data is stored in a binary form, therefore the spare region use sub decoder 23S and the dedicated binary latch and sense amplifier circuit 25 operate only in the binary operation mode.

Then, it is determined on the sub decoder side whether either or both of the data region and the spare region are accessed. Then, based on this determination, as shown in FIG. 2, word lines etc. of both sides of the memory string selected by the address by the data region use main decoder 22D or the spare region use main decoder 22S are connected to the sub decoders 23D and 23S.

Then, the binary use drive voltages are supplied from the data region use sub decoder 23D to the supply lines VCGD0 to VCGD7, VDSGD, and VSSGD of the word line and selection gate line use drive voltage when receiving the binary signal 2LVL, while the 4-value drive voltages are supplied to the supply lines VCGD0 to VCGD7, VDSGD, and VSSGD of the word line and selection gate line use drive voltage when receiving the 4-value (multi-level) signal 4LVL.

Further, the binary use drive voltages are supplied from the spare region use sub decoder 23S to the supply lines VCGS0 to VCGS7, VDSGS and VSSGS of the word line and selection gate line use drive voltage.

Then, where the memory array 21D is used as the data region 211, the 4-value data is stored or read by receiving the multi-level signal 4LVL. On the other hand, when a specific block is used as the spare region for storing management information for which a high reliability is required, the binary data is stored or read.

Further, where either of the data region 21D or spare region 21S is accessed, the output of the not accessed side sub decoder is set at the ground voltage GND.

Namely, since there are two systems of sub decoders, 0V is output to the not accessed side when the read/write is carried out for only one of the data region and spare region.

By this, the so-called read/write disturb margin is improved.

Further, a sufficient current flows even If the gate voltage (VPRD2) of the pass transistor (transfer gate) when reading binary data is set lower than the voltage (VPRD1) of the pass transistor when reading multi-level data.

For this reason, even If VPRD1>VPRD2 is set, there is no influence upon the first access time. By setting the system in this way, the read disturb margin of the spare region is improved.

Further, when writing, in the device, in order to avoid excess writing, the writing is carried out with a short write pulse and a verify operation is repeated. The write operation is repeated until all cells on the write page are sufficiently written.

Accordingly, the cell which is written fast is judged to be sufficiently written in an early stage, and the latch data is inverted to the write inhibit data. After this, there is gate disturbance until the cell written at the slowest speed is Judged to be sufficiently written. This leads to a reduction of the reliability.

Contrary to this, in the device of FIG. 1, when the writing is simultaneously carried out in the data region 21D and the spare region 21S, the number of write operations until all cells are judged to be sufficiently written is smaller in the spare region 21S into which the binary data is written due to the amount of shift of the threshold voltage Vth.

Then, the write end judgement circuits 241, 242, and 251 provided in the latch and sense amplifier circuits 24 and 25 judge the end of the writing individually for the data region 21D and the spare region 21S.

As the result of this judgement, end signals SENDDH and SENDDL or SENDS are output to the data region use sub decoder 23D or the spare region use sub decoder 23S from the judgement circuits 241 and 242 or 251 previously judging that all cells have been sufficiently written, and all of the output voltages of the sub decoders corresponding to the sufficiently written region are switched to 0V. Namely, the operation of the sub decoder where the writing is sufficient is stopped.

By this, the write disturb margin of the cell of the region in which the writing is ended early is improved. Usually, this leads to an improvement of the disturb margin of the spare region.

Further, at so-called additional writing, only the spare region use sub decoder 21S is controlled to the operation state. The data region use sub decoder 21D is controlled to the non-operation state.

By this, additional writing is realized for the data region 21D without write disturbance.

Further, since the latch and sense amplifier circuit 24 is constituted so that the data region side can operate in the 4-level operation mode or the binary operation mode, in the case of specifications of the IC memory card, established based on the specifications of, for example, a binary flash memory, in which the data written in the spare region 21S is arranged also in the data region 21D for the purpose of the package management, the inconvenience that if a multi-level flash memory is configured and the data region becomes a dedicated multi-level region, the management information cannot be placed in the data region and, due to this, a binary flash memory cannot be changed to a multi-level flash memory having a cheaper bit cost, is eliminated.

As explained above, according to the present embodiment, the memory cell region is divided into the data region 21D capable of storing for a plurality of levels of multi-level data, for example, 4-level and binary data, and the spare region 21S capable of storing binary data having a low number of levels of multi-level data. Further, provision is made of the data region use sub decoder 23D and memory decoder 22D for supplying a drive voltage to the data region 21D, the spare region use sub decoder 23S and memory decoder 22S for supplying the drive voltage to the spare region 21S, the latch circuit 24 for transferring data with the data region in accordance with the number of levels of the multi-level data stored in the data region 21D and stopping the supply of the drive voltage of the sub decoder 23D when the transfer of data is normally completed, and the latch circuit 25 for transferring the data with the spare region 21S and stopping the supply of the drive voltage of the sub decoder 23S when the transfer of data is normally completed. Therefore, there are the advantages that the reliability of the spare region 21S can be improved, the reliability of the data region can be improved in accordance with the method of use, and the function of additional writing can be realized in the multi-level memory.

Further, when applied to an IC memory card, without changing the specifications of the IC card, the reliability of the spare region 21S can be made equivalent to that of a binary flash memory, the reliability of the management information etc. arranged in the data region 21D can be made equivalent to that of a binary flash memory, and in addition the data region 21D can be constituted by a multi-level flash memory having a cheap bit cost, therefore an improvement of the reliability can be achieved and in addition an increase of the cost can be suppressed.

While the invention has been described with reference to specific embodiments chosen for purposes of illustration, it should be apparent that numerous modifications could be made thereto by those skilled in the art without departing from the basic concept and scope of the invention.

What is claimed is:

1. A nonvolatile semiconductor memory device having a memory cell region in which a plurality of memory cell transistors capable of storing binary or trinary or more multi-level data are arranged, wherein the memory cell region is divided into at least two regions, the memory device comprising:

means for storing the data by different numbers of levels of multi-level data for at least the two divided regions, wherein at least one of the divided regions is arranged as a data region capable of storing data having a high number of levels of multi-level data and at least one of the remaining divided regions is arranged as a spare region capable of storing data having a low number of levels of multi-level data;

a first decoding means for supplying a first drive signal to the data region; and a second decoding means for supplying a second drive signal to the spare region.

2. A nonvolatile semiconductor memory device as set forth in claim 1, further comprising:

means for transferring data to the data region in accordance with the number of levels of the multi-level data to be stored in the data region.

3. A nonvolatile semiconductor memory device as set forth in claim 1, further comprising:

a first circuit for transferring data to the data region in accordance with the number of levels of the multi-level data to be stored in the data region and stopping the supply of the first drive signal when the transfer of the data to the data region is normally completed; and a second circuit for transferring data to the spare region and stopping the supply of the second drive signal when the transfer of the data to the spare region is normally completed.

4. A nonvolatile semiconductor memory device as set forth in claim 3, further comprising:

means for stopping the supply of one of the first and second drive signals if one of the data region and spare region to be supplied with the one of the first and second drive signals, respectively, is not selected.

5. A nonvolatile semiconductor memory device as set forth in claim 1, further comprising:

means for stopping the supply of one of the first and second drive signals if one of the data region and snare region to be supplied with the one of the first and second drive signals, respectively is not selected.

6. A nonvolatile semiconductor memory device as set forth in claim 1, wherein the first decoding means exclusively supplies the first drive signal to the word line of the memory cell transistors of the data region, and wherein the second decoding means exclusively supplies the second drive signal to the word line of the memory cell transistors of the spare region.

7. A nonvolatile semiconductor memory device having a memory cell region in which a plurality of memory cell transistors capable of storing binary or trinary or more multi-level data are arranged, wherein the memory cell region is divided into a data region in which data having a high number of levels of multi-level data can be stored and a spare region in which data having a low number of levels of multi-level data can be stored, the improvement comprising:

a first decoding means for supplying a first drive signal to the data region, and a second decoding means for supplying a second drive signal to the spare region.

8. A nonvolatile semiconductor memory device as set forth in claim 7, further comprising:

a first latch circuit for transferring data to the data region in accordance with the number of levels of the multi-level data to be stored in the data region and stopping the supply of the first drive signal when the transfer of the data to the data region is normally completed; and a second latch circuit for transferring data to the spare region and stopping the supply of the second drive signal when the transfer of the data to the spare region is normally completed.

9. A nonvolatile semiconductor memory device as set forth in claim 7, further comprising:

means for stopping the supply of one of the first and second drive signals if the data region or spare region to be supplied with the one of the first and second drive signals, respectively, is not selected.

10. A nonvolatile semiconductor memory device as set forth in claim 7, wherein the plurality of the memory cell transistors are connected in series to form a NAND type structure.

11. A nonvolatile semiconductor memory device as set forth in claim 7, wherein the first decoding means exclusively supplies the first drive signal to the word line of the memory cell transistors of the data region, and wherein the second decoding means exclusively supplies the second drive signal to the word line of the memory cell transistors of the spare region.

12. An IC memory card capable of storing and reproducing data with a predetermined apparatus, comprising:

a nonvolatile semiconductor memory device having a memory cell region in which a plurality of memory cell transistors capable of storing binary or trinary or more multi-level data are arranged, the memory cell region being divided into a data region in which data having a high number of levels of multi-level data can be stored and a spare region in which data having a low number of levels of multi-level data can be stored;

a first decoding means for supplying a first drive signal to the data region; and a second decoding means for supplying a second drive signal to the spare region.

13. An IC memory card as set forth in claim 12, further comprising:

a first latch circuit for transferring data to the data region in accordance with the number of levels of multi-level data to be stored in the data region and stopping the supply of the first drive signal when the transfer of the data to the data region is normally completed; and a second latch circuit for transferring data to the spare region and stopping the supply of the second drive signal when the transfer of the data to the spare region is normally completed.

14. An IC memory card as set forth in claim 12, further comprising:

means for stopping the supply of at least one of the first and second drive signals if the data region or spare region to be supplied with the one of the first and second drive signals, respectively, is not selected.

15. An IC memory card as set forth in claim 12, wherein the plurality of the memory cell transistors are connected in series to form a NAND type structure.

16. A nonvolatile semiconductor memory device as set forth in claim 12, wherein the first decoding means exclusively supplies the first drive signal to the word line of the memory cell transistors of the data region, and wherein the second decoding means exclusively supplies the second drive signal to the word line of the memory cell transistors of the spare region.

* * * * *